(12) United States Patent
Park

(10) Patent No.: US 7,221,091 B2
(45) Date of Patent: May 22, 2007

(54) ORGANIC ELECTROLUMINESCENT DISPLAY DEVICE AND METHOD OF FABRICATING THE SAME

(75) Inventor: Jae-Yong Park, Kyounggi-do (KR)

(73) Assignee: LG.Philips LCD Co., Ltd., Seoul (KR)

( * ) Notice: Subject to any disclaimer, the term of this patent is extended or adjusted under 35 U.S.C. 154(b) by 201 days.

(21) Appl. No.: 10/825,247

(22) Filed: Apr. 16, 2004

(65) Prior Publication Data

US 2005/0140281 A1  Jun. 30, 2005

(30) Foreign Application Priority Data

Dec. 29, 2003 (KR) ............... 10-2003-0099241

(51) Int. Cl.
*H01J 63/04* (2006.01)

(52) U.S. Cl. ............ 313/505; 313/504; 313/292; 315/169.3

(58) Field of Classification Search ........ 313/498, 313/505, 504, 292, 501, 502, 503, 506, 507, 313/512, 169.3, 509
See application file for complete search history.

(56) References Cited

U.S. PATENT DOCUMENTS 6,608,449 B2 * 8/2003 Fukunaga ............ 315/169.3
6,614,174 B1 * 9/2003 Urabe et al. ............ 313/504
6,844,673 B1 * 1/2005 Bernkopf ............... 313/506
2001/0004190 A1 * 6/2001 Nishi et al. ............ 313/506
2005/0176242 A1 * 8/2005 Kawase .................. 438/637

* cited by examiner

*Primary Examiner*—Joseph Williams
*Assistant Examiner*—Hana Asmat Sanei
(74) *Attorney, Agent, or Firm*—Morgan, Lewis & Bockius, LLP

(57) ABSTRACT

An organic electoluminescent (EL) display device and methodology of fabricating the same includes a first array substrate having an anode electrode, a cathode electrode and an organic layer between the anode electrode and the cathode electrode; a second array substrate having at least one driving thin film transistor formed thereon, the at least one driving thin film transistor to supply a driving signal to either one of the anode electrode and the cathode electrode; a first spacer made of conductive material to supply the driving signal to either one of the anode electrode and the cathode electrode, the first spacer being formed between the first and the second array substrates; and a second spacer made of an adhesive material to fix together the first and the second array substrates, the second spacer being formed between the first and the second array substrates.

19 Claims, 8 Drawing Sheets

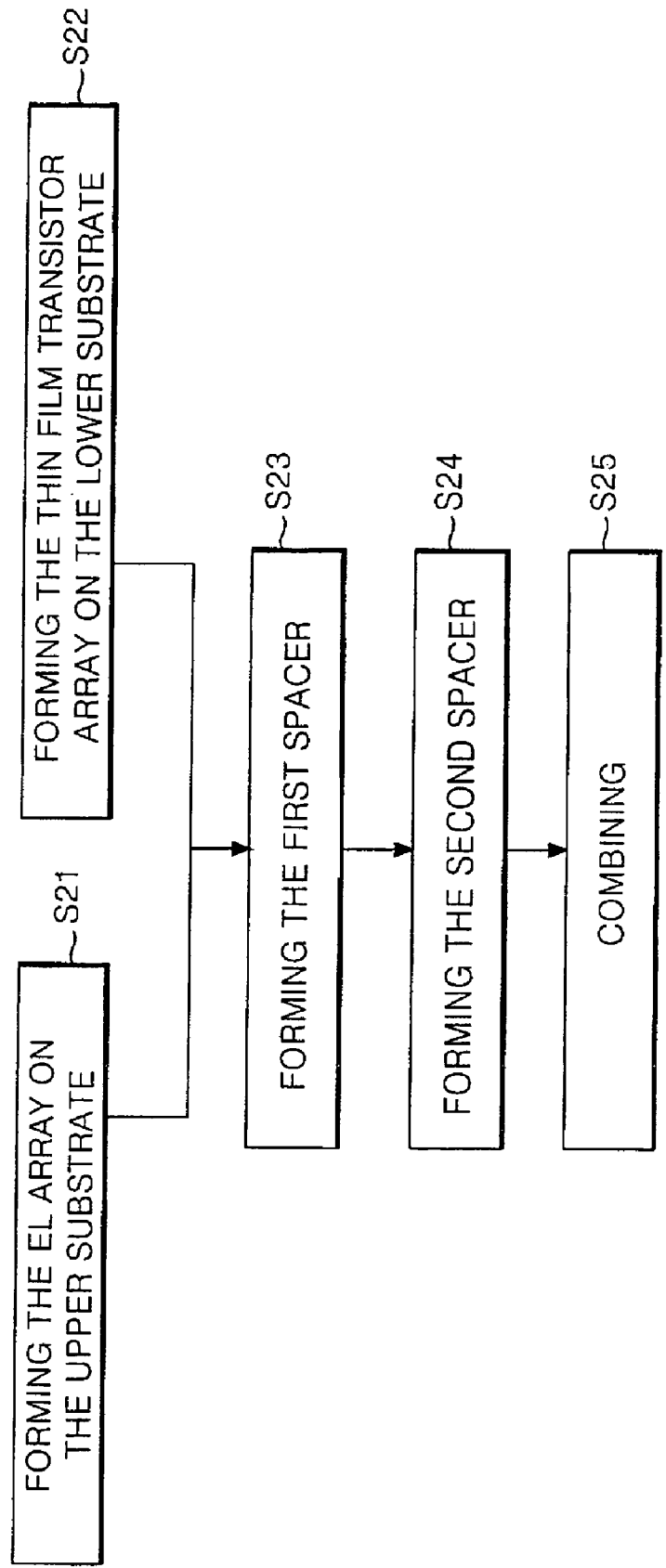

ORGANIC ELECTROLUMINESCENT DISPLAY DEVICE AND METHOD OF FABRICATING THE SAME

BACKGROUND OF THE INVENTION

The present invention claims the benefit of the Korean Patent Application No. P2003-99241, filed in Korea on Dec. 29, 2003, which is hereby incorporated by reference.

1. Field of the Invention

The present invention relates to an organic electroluminescent device, and more particularly, to an organic electroluminescent display device that includes first and second array substrates and at least one spacer, and a method of fabricating the same.

2. Discussion of the Related Art

In recent times, various flat panel display technologies have been developed resulting in the display device having an overall reduced bulk and weight. Display devices utilizing these flat panel display technologies are free from the disadvantages of prior technologies that utilized a typically bulky and heavy cathode ray tube (CRT) to generate the display. Such flat panel display technologies can be of various types, including a liquid crystal display (LCD), a field emission display (FED), a plasma display panel (PDP), and an electroluminescent (EL) display device.

Among these various flat panel display types, the structure and fabrication process of the PDP is relatively simple, resulting in the PDP display type being particularly advantageous for light-weight, large-sized applications. However, the light emission efficiency and brightness level of such PDPs are relatively low. At the same time, such PDP devices typically consume a large amount of power.

In comparison, LCD technology, which utilizes a thin film transistor (TFT) as a switching device, is not preferred for large-sized applications because it is fabricated by a relatively-complex semiconductor process. Nevertheless, the demand for LCD technology continues to increase for relatively small display applications, such as in notebook computer displays. However, particular disadvantages of LCD technology include its high power consumption, its difficulty to be made large-sized, and its inclusion of a backlight unit as a light source. Further, LCD arrangements result in a high amount of optical loss that results from its utilization of optical devices such as a polarizing filter, a prism sheet and a diffusion panel. Moreover, the viewing angle of such LCD arrangements is narrow, as compared to other display types.

As compared with LCD technology, EL display devices are generally classified into two types: inorganic EL devices and organic EL devices, based on the material making up its light-emission layer. A spontaneous light-emitting EL display device has an advantage over other flat panel display types in that it has a fast response speed, a high light-emission efficiency, and a superior brightness level. Moreover, EL display devices are advantageous in that they have a wide viewing angle.

The organic EL display device, as shown in FIG. 1, includes sub pixels 50 wherein each sub pixel is arranged at the intersection area of a gate line GL and a data line DL. Each sub pixel 50 receives a data signal from the data line DL and generates light corresponding to the data signal when a gate pulse is applied to the gate line GL.

In this regard, the sub pixel 50 includes an EL cell OEL having a cathode connected to a ground voltage source GND. The sub pixel 50 also includes a cell driver 52 connected to the gate line GL, the data line DL and a supply voltage source VDD. The cell driver 52 is also connected to the anode of the EL cell OEL for driving the EL cell OEL. The cell driver 52 includes a switching thin film transistor T1, a driving thin film transistor T2, and a capacitor C.

When a scan pulse is applied to the gate line GL, the switching thin film transistor T1 is turned-on and it supplies a data signal from the data line DL to a node N. The data signal supplied to the node N is charged in the capacitor C. Simultaneously the data signal is applied to a gate terminal of the driving thin film transistor T2. The driving thin film transistor T2 controls the amount of current I applied to the EL cell OEL from the supply voltage source VDD in response to the data signal supplied to the gate terminal to thereby control the amount of light emission of the EL cell OEL. As a result, even though the switching thin film transistor T1 may be turned off, since the data signal is discharged from the capacitor C, the driving thin film transistor T2 continues to supply current I from the supply voltage source VDD to the EL cell OEL until the data signal of the next frame is applied. This results in the EL cell OEL light emission being sustained.

FIG. 2 is a sectional view representing a pixel of the organic EL as shown in FIG. 1 in which the pixel includes red, green and blue sub pixels to form one pixel region. The EL display, as shown in FIG. 2, includes a substrate 2 and a packaging plate 12, which are combined by a sealant 18. A plurality of EL cells are formed within a display region arranged by the sealant 18 on the substrate 2. Each of these EL cells includes an organic layer formed between an anode electrode 4 and a cathode electrode 6, which cross each other and are insulated from each other.

Each anode electrode 4 is separated by a predetermined distance from other anode electrodes on the substrate 2. A first driving signal is supplied through the driving thin film transistor T2 to the anode electrode 4 to emit holes from the anode electrode 4.

The organic layer 10 includes a hole carrier layer 10a which carries holes emitted from the anode electrode 4 to a light-emitting layer 10b. The light-emitting layer 10b generates visible light by a combination of the holes and electrons emitted from the cathode electrode 6. An electron carrier layer 10c carries the electrons to a light-emitting layer 10b.

The cathode electrode 6 is separated from other cathode electrodes by a predetermined distance on the organic layer 10 and is formed crossing the anode electrode 4. Furthermore, a second driving signal is supplied to the cathode electrode 6 to emit the electrons.

The packaging plate 12, made up of a metallic material, includes an oxygen and moisture absorbent material. The packaging plate 12 serves to radiate heat that is generated upon the light-emission of the organic layer 10. The packaging plate 12 also serves to protect the organic layer 10 from external forces, as well as from moisture and oxygen in the atmosphere.

If a driving signal is applied to the anode electrode 4 and the cathode electrode 6 in the organic EL display device, the electrons and the holes are emitted and then re-combined to generate visible light from the organic layer 10. At this time, the visible light exits to the exterior via the anode electrode 4 and the substrate 2, where it is used to display a picture or image.

FIG. 3 is a flow diagram representing a manufacturing process of the related art organic EL display device. At step S11, a signal line including a gate line, a data line and a supply line, and a thin film transistor array including a driving thin film transistor and a switching thin film transistor are formed on the substrate. At step S12, an anode electrode is formed to connect to a drain electrode of the driving thin film transistor. At step S13, an organic layer including a hole carrier layer, a light-emitting layer and electron carrier layer is formed on the anode electrode. At step S14, a cathode electrode intersecting with the anode electrode is formed on the organic layer. Then, at step S15, a packaging plate is combined with the substrate by a sealant in order to protect the substrate having the thin film transistor array, the anode electrode, the organic layer and the cathode electrode formed thereon.

As described above, the related art organic EL display device is made by combining the packaging plate with the substrate having the thin film transistor and the organic light-emitting layer. In such an arrangement, the overall organic EL display device's production yield is determined based on both the production yield of the thin film transistor and the production yield of the organic layer. Particularly, the production yield of the organic EL display device is determined depending on the production yield of the organic layer, which has a high defective rate, especially when compared to the thin film transistor's defective rate. For instance, even though a thin film transistor formed on the substrate has a good quality and acceptable production yield, the overall organic EL display device can be regarded as defective as a result of a poor production yield associated with the organic layer having a thin film of about 1000 Å in thickness. Therefore, this results in a problem with such related art arrangements in that the costs of raw materials and other expenses associated with manufacturing a thin film transistor of good quality are sacrificed, while the overall device production yield is lowered.

Moreover, the related art organic EL display device is a lower portion light-emitting type in which the visible light rays exit to the exterior via the rear surface of the substrate. While this arrangement of the related art organic EL display device results in a high stability and a desirable degree of freedom of processing by the packaging plate, it also suffers from a particular difficulty to adapt to high-resolution applications.

SUMMARY OF THE INVENTION

Accordingly, the present invention is directed to an organic electroluminescent device and a method of fabricating the same that substantially obviate one or more of the problems due to limitations and disadvantages of the related art.

An object of the present invention to provide an organic electroluminescent (EL) display device having an improved production yield and a high aperture ratio, and a method of fabricating the same.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, an organic electroluminescent (EL) device includes a first array substrate having an anode electrode, a cathode electrode and an organic layer between the anode electrode and the cathode electrode; a second array substrate having at least one driving thin film transistor formed thereon, the at least one driving thin film transistor to supply a driving signal to either one of the anode electrode and the cathode electrode; a first spacer made of conductive material to supply the driving signal to either one of the anode electrode and the cathode electrode, the first spacer being formed between the first and the second array substrates; and a second spacer made of an adhesive material to fix together the first and the second array substrates, the second spacer being formed between the first and the second array substrates.

In another aspect, a method of fabricating an organic electroluminescent (EL) display device includes forming a first array substrate including an anode electrode, a cathode electrode and an organic layer between the anode electrode and the cathode electrode; forming a second array substrate including at least one driving thin film transistor formed thereon to supply a driving signal to either one of the anode electrode and the cathode electrode; forming a first spacer of conductive material between the first and the second array substrates to supply the driving signal to either one of the anode electrode and the cathode electrode; and forming a second spacer of an adhesive material between the first and the second array substrates to fix together the first and second array substrates.

In another aspect, an organic electroluminescent (EL) display device includes a first array substrate having an anode electrode, a cathode electrode and an organic layer between the anode electrode and the cathode electrode; a second array substrate having at least one driving thin film transistor formed thereon, the at least one driving thin film transistor to supply a driving signal to either one of the anode electrode and the cathode electrode via a conductor; and a spacer made of an electrically insulating material to fix together the first and the second array substrates, the spacer being formed between the first and the second array substrates.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

FIG. 7 is a flow diagram representing the method of fabricating the organic electroluminescent device according to an embodiment of the present invention.

DETAILED DESCRIPTION OF THE EMBODIMENTS

Reference will now be made in detail to the preferred embodiments of the present invention, examples of which are illustrated in the accompanying drawings.

Figure 1:
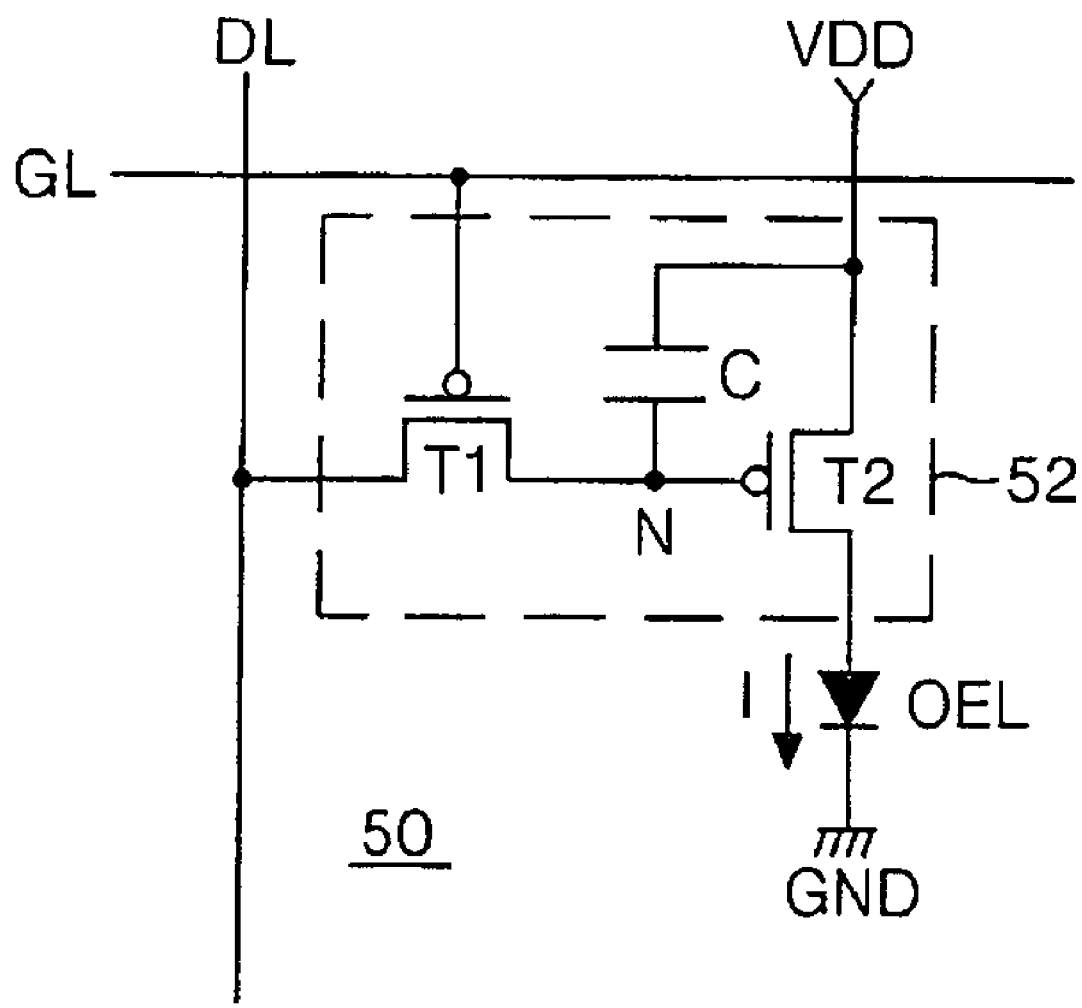
FIG. 1 is a circuit diagram of an organic electroluminescent device according to the related art.
Figure 2:
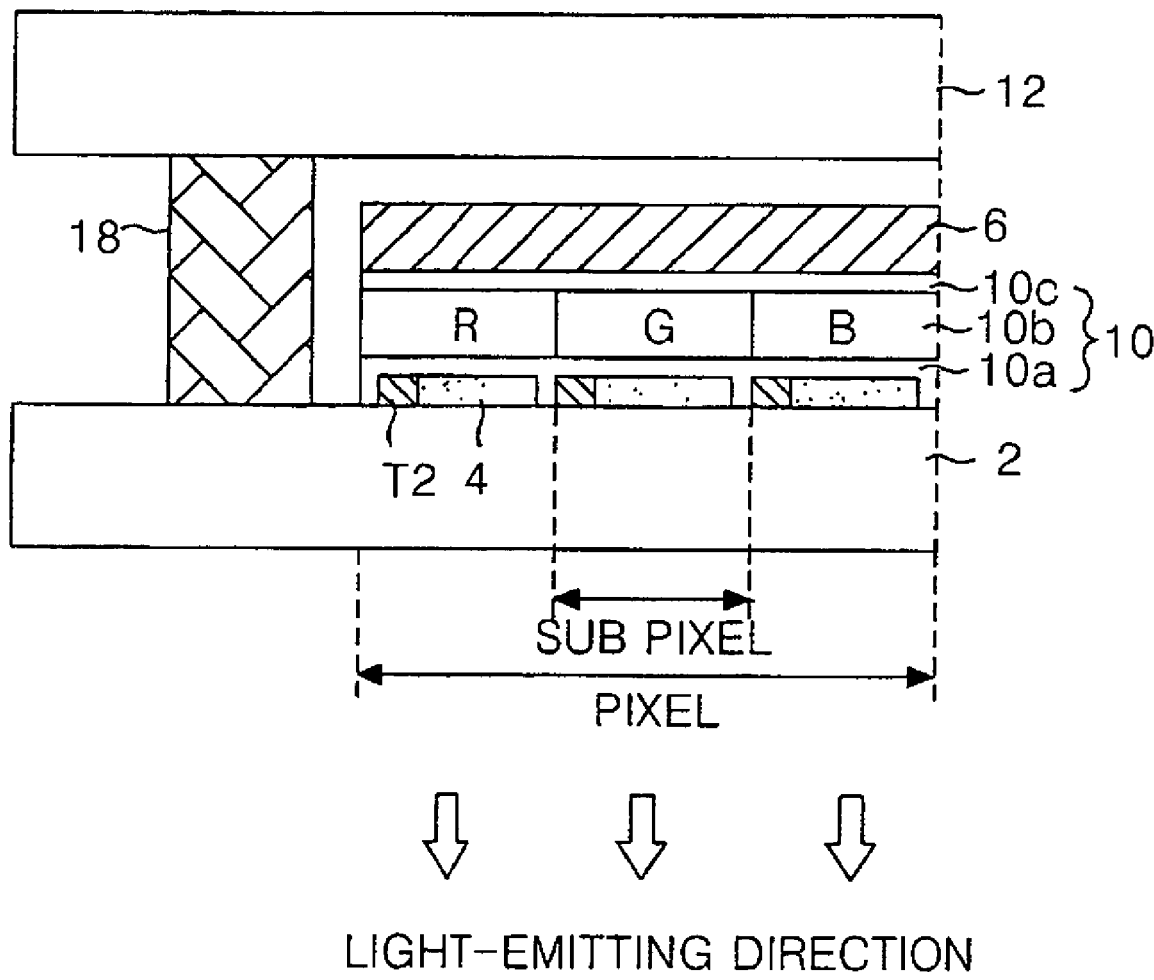
FIG. 2 is a schematic cross-sectional view of the related art organic electroluminescent device shown in FIG. 1.
Figure 3:
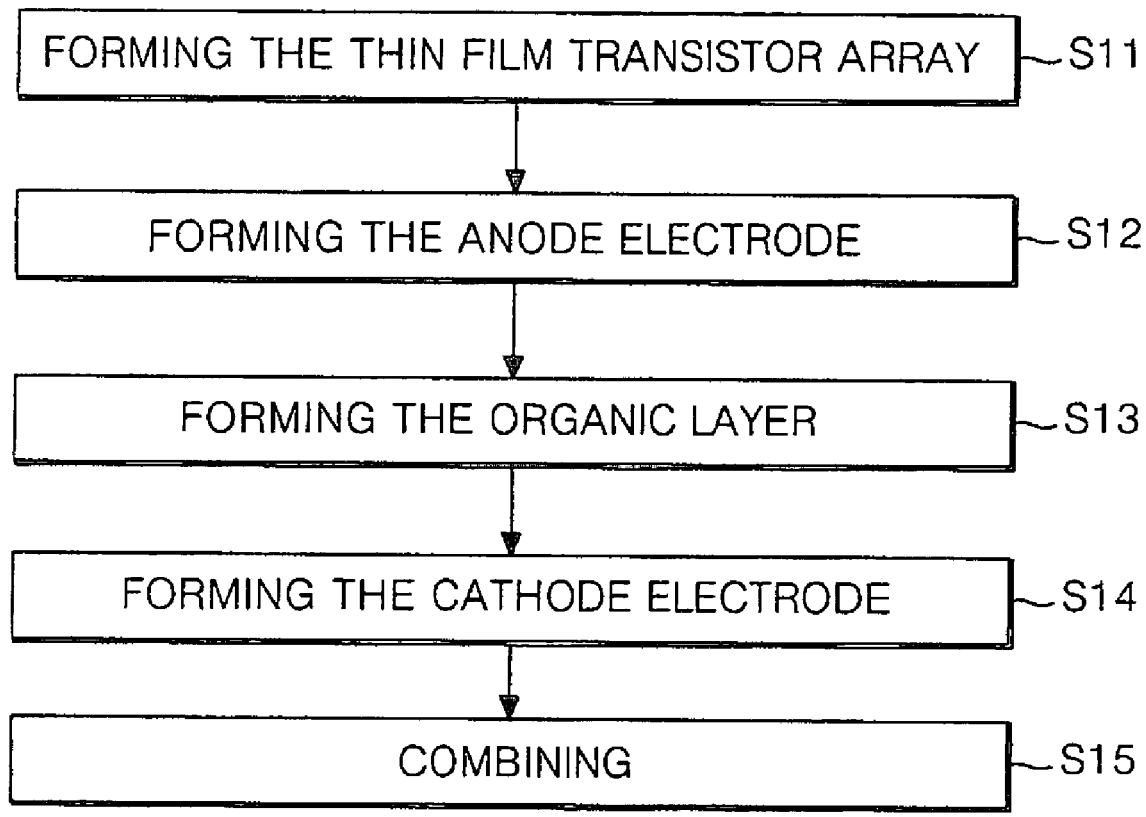
FIG. 3 is a flow diagram representing the method of fabricating the related art organic electroluminescent device shown in FIG. 2.
Figure 4:
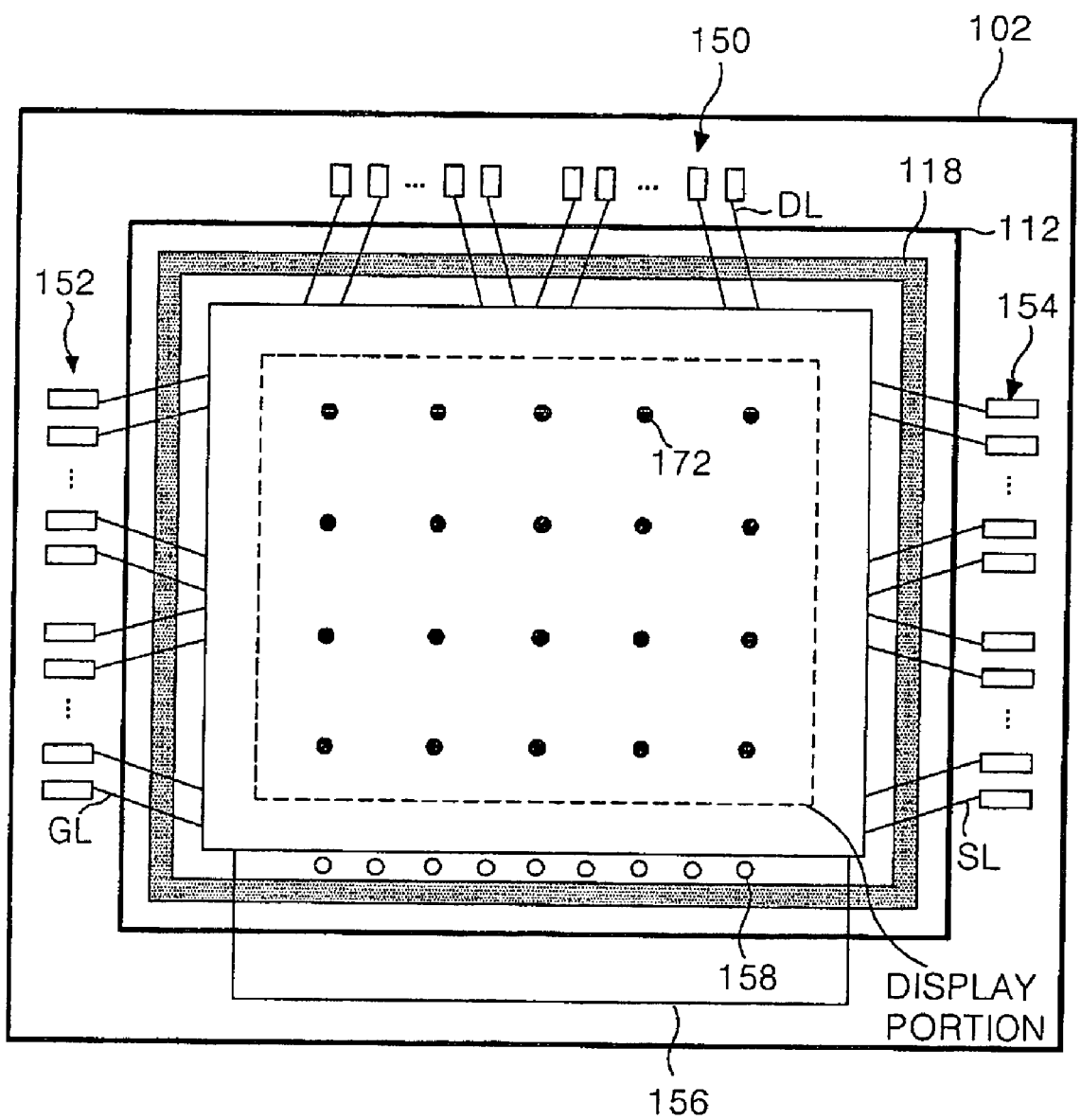
FIG. 4 is a schematic plane view showing an organic electroluminescent device according to an embodiment of the present invention.
Figure 5A:
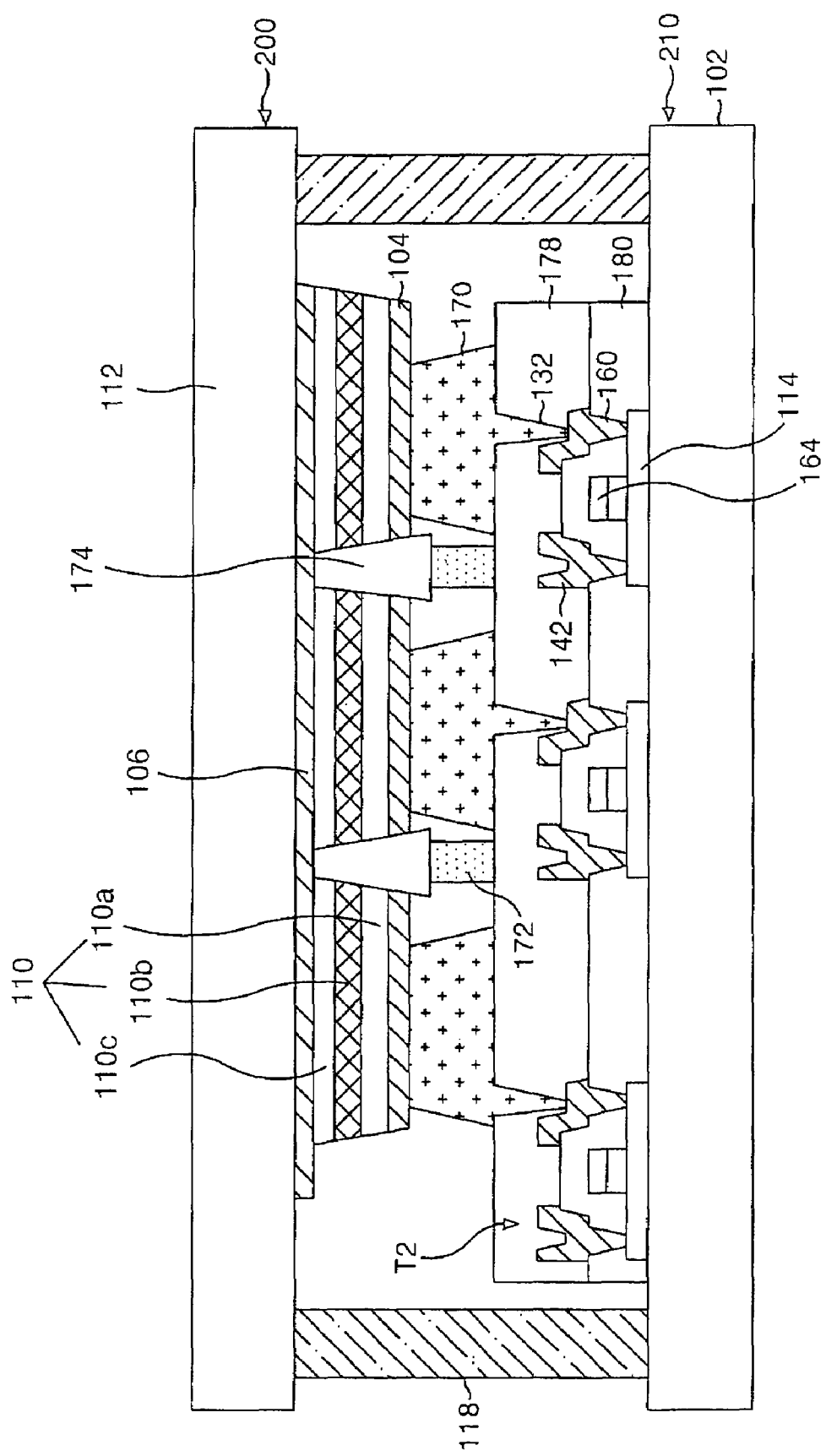
FIGS. 5A and 5B are schematic cross-sectional views showing the organic electroluminescent device of FIG. 4.
Figure 5B:
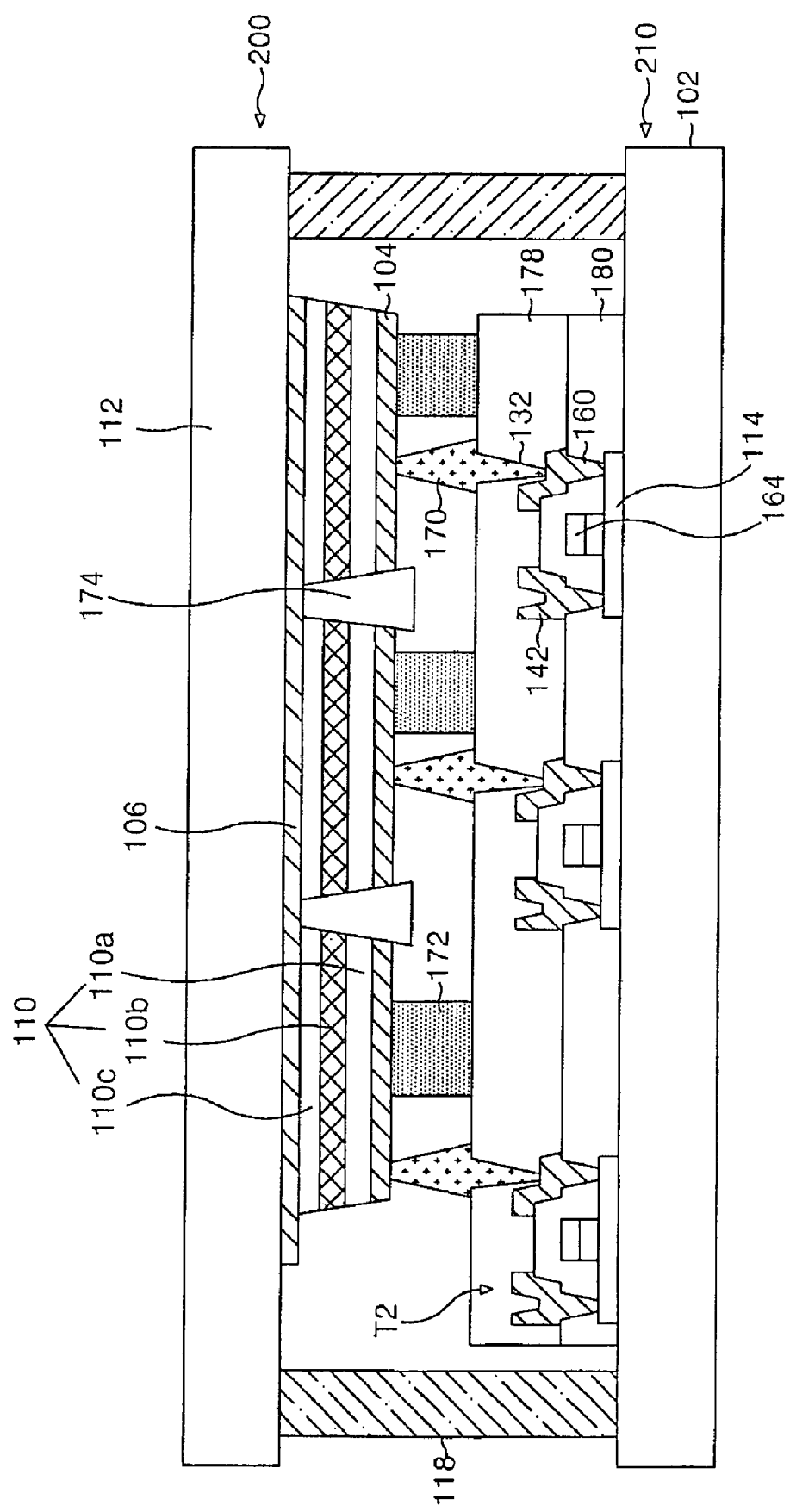

FIG. 4 is a schematic plane view showing an organic electroluminescent device according to an embodiment of the present invention. FIGS. 5A and 5B are schematic cross-sectional views showing the organic electroluminescent device of FIG. 4.

The organic EL device shown in FIGS. 4 and 5 includes an upper array substrate 200 having a plurality of EL cells, a lower array substrate 210 having a thin film transistor array for driving the EL cells, a plurality of first spacers 170 for connecting the EL cells and the thin film transistor array, and a plurality of second spacers 172 formed between the first spacers 170.

The upper array substrate 200 includes an anode electrode 104 and a cathode electrode 106 isolated from each other and crossing each other on the upper substrate 112, a barrier rib 174 formed between the anode electrode 104 and the cathode electrode 106, and an organic layer 110 located in between the anode electrode 104 and the cathode electrode 106. It is understood that the anode electrode 104 and the cathode electrode 106 can be interchanged.

Each cathode electrode 106 is separated from adjacent cathode electrodes by a predetermined distance on the upper substrate 112. The cathode electrode 106 is supplied with a first driving signal used to emit electrons from the cathode electrode 106.

The anode electrode 104 is separated from adjacent anode electrodes by a predetermined distance and crosses with the cathode electrode 106 on the organic layer 110. The anode electrode 104 is supplied with a second driving signal used to emit holes from the anode electrode 104 via the driving thin film transistor T2 and the first spacer 170.

The barrier rib 174 is formed to define the EL cell so that the cathode electrode 106 of the adjacent EL cell is separated from the organic layer 110.

The organic layer 110 includes a hole carrier layer 110a for carrying holes, a light-emitting layer 110b for generating visible light by a combination of the holes and electrons emitted from the cathode electrode 106, and an electron carrier layer 110c for carrying the electrons to a light-emitting layer 110b, which are sequentially accumulated on the anode electrode 104.

The lower array substrate 210 includes a display portion having a thin film transistor formed thereon and a pad portion located outside of the display portion.

The pad portion includes a gate pad 152 connected with a gate line GL, a data pad 150 connected with a data line DL, a supply pad 154 connected with a supply line SL and a cathode pad 156 connected to the cathode electrode 106.

The cathode pad 156 supplies a driving signal to the cathode electrode 106 via a conductive dot 158 located at an inside of a seal line 118. The conductive dot 158 is made of metallic material identical to the first spacer 170 or a separate conductive metal.

Figure 6:
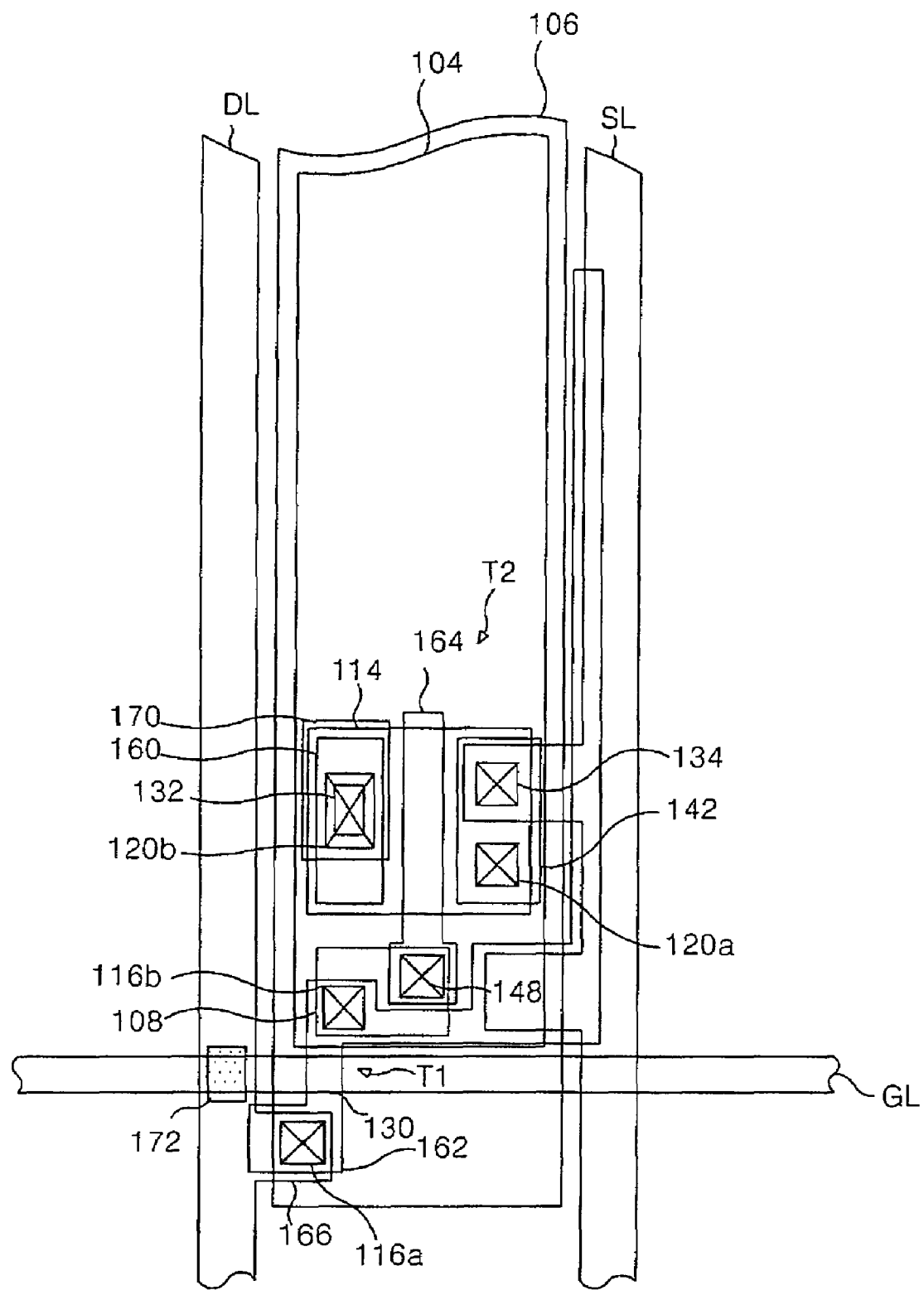
FIG. 6 is a schematic plane view showing a sub pixel of the organic electroluminescent device of FIG. 4.

The display portion, as shown in FIG. 6, includes a driving thin film transistor T2 formed at an intersection of the supply line SL connected to the gate line GL and the supply voltage source. The display portion also includes a switching thin film transistor T1 connected to the driving thin film transistor T2.

The switching thin film transistor T1 includes a gate electrode 130 included in the gate line GL, a source electrode 166 connected with the data line DL, a drain electrode 108 connected to a gate electrode 164 of the driving thin film transistor T2 via a contact hole 148, and an active layer 162 for forming a conductive channel between the source electrode 166 and the drain electrode 108. The active layer 162 is connected to the source electrode 166 and the drain electrode 108 through first and second switching contact holes 116a and 116b.

The driving thin film transistor T2 includes a gate electrode 164 connected to the drain electrode 108 of the switching thin film transistor T1, a source electrode 142 connected to the supply line SL via the supply contact hole 134, a drain electrode 160 connected to the first spacer 170 via a pixel contact hole 132, and an active layer 114 for forming a conductive channel between the source electrode 142 and the drain electrode 160. The active layer 114 is connected to the source electrode 142 and the drain electrode 160 through first and second driving contact holes 120a and 120b. The driving thin film transistor T2 selectively supplies a supply voltage signal VDD from the supply line SL to the anode electrode 104 through the first spacer 170 in response to the signal from the gate line GL.

The first spacer 170, as shown in FIGS. 5A and 5B, electrically connects the anode electrode 104 to the drain electrode 160 of the driving thin film transistor T2. The drain electrode 160 is exposed through the pixel contact hole 132 which penetrates a passivation film 178. The first spacer 170 is made of a metal having a low resistivity value.

A second spacer 172 is formed for every EL cell and prevents the substrate from bending upon the formation of a large-sized EL device on the substrate to thereby provide a uniform cell gap across the entire area of the substrate. Moreover, in an arrangement where the first spacer 170 is connected to the drain electrode 160 of the driving thin film transistor T2 and the anode electrode 104 by a vacuum process, for example, the second spacer 172 serves to prevent the separation and disconnection of the anode electrode 104 from the drain electrode 160 due to external forces.

The second spacer 172 is made of a material, for example, that is identical to the material making up a seal line 118. For example, the second spacer can be formed of an electrically insulating material. The second spacer 172 is formed so as to overlap with at least one of the barrier rib 174, the gate line GL, the data line DL, the supply line SL, the switching thin film transistor T1, and the driving thin film transistor T2. However, the second spacer 172 does not overlap with the first spacer 170.

For instance, as shown in FIG. 5A, the second spacer 172 is formed to so as to overlap with the barrier rib 174 and to be separate from the anode electrode 104. Alternately, as shown in FIG. 5B, the second spacer 172 is formed so as to be in contact with the anode electrode 104 and so as to overlap with the pixel area where the gate line GL and the data line DL intersect with one another.

As set forth above, according to the organic display device of the present invention, the upper array substrate and the lower array substrate are fixed in place by the second spacer. Accordingly, it is possible to prevent defects that would otherwise result from the disconnection of the first spacer from the anode electrode. Because such a disconnection is prevented, the overall impact resistance vibration resistance of the display device arrangement of the instant application is enhanced.

FIG. 7 is a flow diagram representing the method of fabricating the organic electroluminescent device according to an embodiment of the present invention.

Steps S21 and S22 of FIG. 7 designate steps in which an EL array is formed on the upper substrate and a thin film transistor array is formed on the lower substrate, respectively. More specifically, a cathode electrode, an organic layer formed on the cathode electrode, a barrier rib separating the cathode electrode and the organic layer on a pixel basis, and a EL array having the anode electrode crossing the cathode electrode are formed on the upper substrate.

Formed on the lower substrate are a gate line, a data line crossing with the gate line, a supply line formed in parallel with the data line, a switching thin film transistor located at the intersection of the gate line and data line, a driving thin film transistor connected with the switching thin film transistor. The driving thin film transistor is connected to the supply line. A driving thin film transistor array is provided having a passivation film which protects the switching thin film transistor and the driving thin film transistor and having a pixel contact hole to expose the drain electrode of the driving thin film transistor.

At step S23, a first spacer is then formed on either one of the upper substrate and the lower substrate. Here, the drain electrode of the driving thin film transistor, which is exposed through the pixel contact hole, is connected to the anode electrode via the first spacer.

Thereafter, at step S24, a second spacer is formed on one of the upper substrate and the lower substrate. Here, the second spacer overlaps with at least one of the gate line, the data line, the supply line, the switching thin film transistor, the driving thin film transistor and the barrier rib using an inkjet or screen printing method, for example.

At step S25, a seal line is then formed along the outer portion of the display portion using a dispenser or screen-printing method, for example, in order to combine the upper substrate and the lower substrate. After combining the upper substrate and the lower substrate using the seal line, the seal line is hardened by ultraviolet rays, for example.

As mentioned above, in the organic electroluminescent and fabricating method thereof according to embodiments of the present invention, the EL array formed on the upper substrate and the driving thin film transistor array are electrically connected through the first spacer made of conductive material. Moreover, the upper substrate and lower substrate are fixed in place by the second spacer made of an adhesive material. Accordingly, such an arrangement is able to prevent disconnection of the anode electrode from the first spacer from occurring due to external impacts.

Further, according to embodiments of the present invention, because the organic electroluminescent display device is an upper portion light-emitting type, in which the light generated on the light-emitting layer is emitted to the exterior via the upper substrate, it is possible to guarantee a desirable aperture ratio irrespective of the configuration of the thin film transistor.

Moreover, according to embodiments of the present the invention, since the organic EL cell, including the organic layer, is formed separately from the thin film transistor array, and is thus not formed on the thin film transistor array, it is possible to improve the overall device production yield. In other words, the adverse production yield effects that can often result from the organic layer formation processes, as discussed above in the related art portion of this application, will not impact the production yield of the thin film transistors.

It will be apparent to those skilled in the art that various modifications and variations can be made in the organic electroluminescent device and fabricating method thereof of the present invention without departing from the spirit or scope of the invention. Thus, it is intended that the present invention cover the modifications and variations of this invention provided they come within the scope of the appended claims and their equivalents.

What is claimed is:

1. An organic electroluminescent (EL) display device, comprising:
   a first array substrate having an anode electrode, a cathode electrode and an organic layer between the anode electrode and the cathode electrode;
   a second array substrate having at least one driving thin film transistor formed thereon, the at least one driving thin film transistor to supply a driving signal to either one of the anode electrode and the cathode electrode;
   a first spacer made of conductive material to supply the driving signal to either one of the anode electrode and the cathode electrode, the first spacer being formed between the first and the second array substrates; and
   a second spacer made of an adhesive material to fix together the first and the second array substrates, the second spacer being formed between the first and the second array substrates.

2. The EL display device of claim 1, wherein the first spacer supplies the driving signal to the anode electrode.

3. The EL display device of claim 1, wherein the second spacer is about 3-5 micrometers in height.

4. The EL display device of claim 1, further comprising a sealing member for combining the first array substrate and the second array substrate using a sealant.

5. The EL display device of claim 4, wherein the second spacer is made of a material identical to the material making up the sealing member.

6. The EL display device of claim 1, wherein the second array substrate comprises:
   a gate line;
   a data line crossing the gate line;
   a supply line formed in parallel with the data line;
   a first thin film transistor located at an intersection of the gate line and the data line; and
   a second thin film transistor connected to the supply line and the first thin film transistor.

7. The EL display device of claim 6, wherein the second spacer overlaps with any one of the gate line, the data line, the supply line, the first thin film transistor and the second thin film transistor.

8. The EL display device of claim 6, wherein the second spacer contacts the anode electrode.

9. The EL display device of claim 6, wherein the first spacer is connected to the drain electrode of the second thin film transistor.

10. The EL display device of claim 1, further comprising at least one barrier part defining an EL cell having the anode electrode, the cathode electrode, and the organic layer.

11. The EL display device of claim 10, wherein the second spacer contacts the barrier part.

12. A method of fabricating an organic electroluminescent (EL) display device, comprising:
   forming a first array substrate including an anode electrode, a cathode electrode and an organic layer between the anode electrode and the cathode electrode;
   forming a second array substrate including at least one driving thin film transistor formed thereon to supply a driving signal to either one of the anode electrode and the cathode electrode;

forming a first spacer of conductive material between the first and the second array substrates to supply the driving signal to either one of the anode electrode and the cathode electrode; and forming a second spacer of an adhesive material between the first and the second array substrates to fix together the first and second array substrates.

13. The method of claim 12, further comprising combining the first array substrate and the second array substrate using a sealant.

14. The method of claim 13, wherein the second spacer is formed of a material identical to the material from which the sealant is formed.

15. The method of claim 13, wherein the second spacer is formed to contact the anode electrode.

16. The method of claim 12, wherein forming the second array substrate comprises:

forming a gate line;

forming a data line crossing the gate line;

forming a supply line in parallel with the data line;

forming a first thin film transistor at an intersection of the gate line and the data line; and forming a second thin film transistor connected to the supply line and the first thin film transistor.

17. The method of claim 16, wherein the second spacer is formed to overlap with any one of the gate line, the data line, the supply line, the first thin film transistor, and the second thin film transistor.

18. The method of claim 12, further comprising forming at least one barrier part defining an EL cell having the anode electrode, the cathode electrode, and the organic layer.

19. The method of claim 18, wherein the second spacer is formed to contact the barrier part.

* * * * *